(12) United States Patent
Knutrud

(10) Patent No.: US 6,612,159 B1
(45) Date of Patent: Sep. 2, 2003

(54) OVERLAY REGISTRATION ERROR MEASUREMENT MADE SIMULTANEOUSLY FOR MORE THAN TWO SEMICONDUCTOR WAFER LAYERS

(75) Inventor: Paul C. Knutrud, Marlborough, MA (US)

(73) Assignee: Schlumberger Technologies, Inc., San Jose, CA (US)

( * ) Notice: Subject to any disclaimer, the term of this patent is extended or adjusted under 35 U.S.C. 154(b) by 0 days.

(21) Appl. No.: 09/648,262

(22) Filed: Aug. 25, 2000

Related U.S. Application Data
(60) Provisional application No. 60/150,759, filed on Aug. 26, 1999.

(51) Int. Cl.$^7$ ................................. G01B 5/28
(52) U.S. Cl. ............................................. 73/105
(58) Field of Search ..................... 73/105; 430/22; 438/791, 401

(56) References Cited

U.S. PATENT DOCUMENTS 5,952,132 A  *  9/1999  King ........................... 430/22
6,079,256 A  *  6/2000  Bareket ........................ 73/105

OTHER PUBLICATIONS

"IVS 120 User's Guide for software version 1.50," Dec. 1995.

"A Computer Aided Engineering Workstation for Registration Control," McFadden, Edward A. and Ausschnitt, Christopher P., The Obelisk Group, Shipley Company Inc., in SPIE vol. 1087 Integrated Circuit Metrology, Inspection, and Process Control III (1989) pp. 255–266.

\* cited by examiner

*Primary Examiner*—John F. Niebling
*Assistant Examiner*—André C Stevenson
(74) *Attorney, Agent, or Firm*—Cohen, Pontani, Lieberman & Pavane

(57) ABSTRACT

An improved target and a technique for using it to measure registration relative to each other of more than two layers of a semiconductor wafer. At least first, second and third layers are formed to overlay each other. A first pattern is provided in a designated location of the first layer. A second pattern is provided in a designated location of the second layer, such second pattern having a given shape and a given size, and having at least one discontinuity formed therein at a predetermined location. A third pattern is provided in a designated location of the third layer, such third pattern having the given shape and the given size of the second pattern, and having at least one discontinuity formed therein at a predetermined location, wherein a portion of each one of the second and third patterns fits within the at least one discontinuity in the other when the second and third layers are in registration with each other.

20 Claims, 3 Drawing Sheets

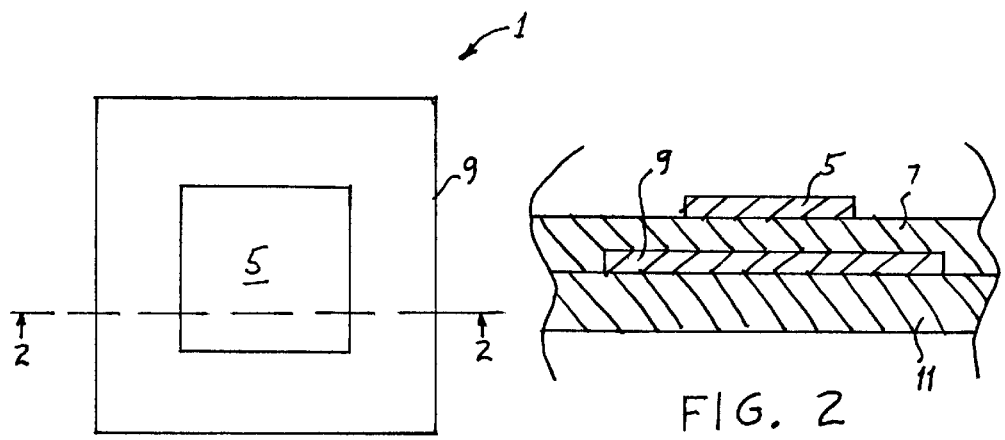
FIG. 1
FIG. 2
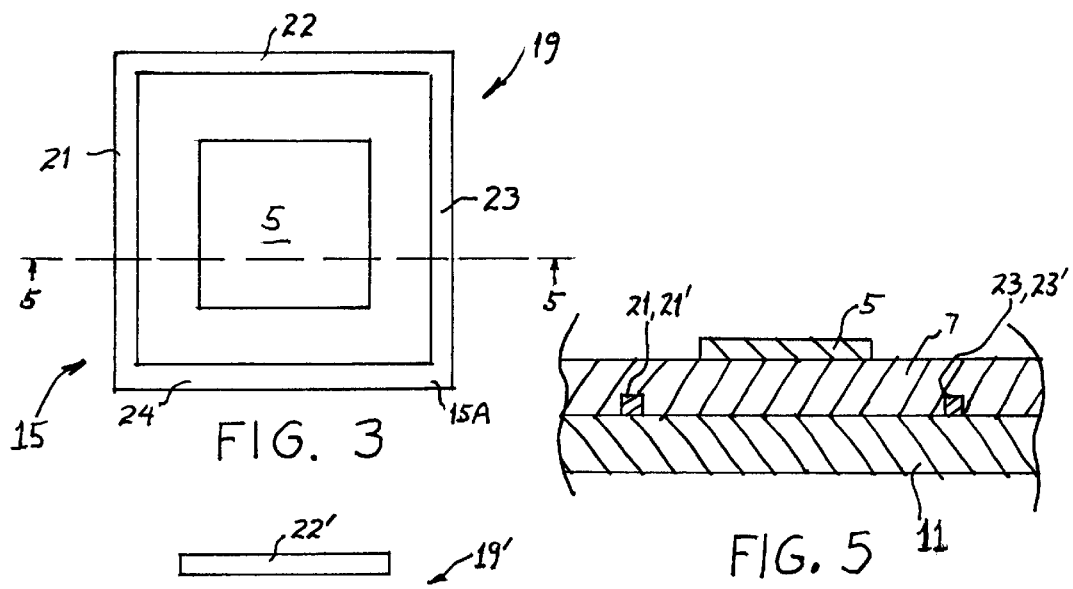
FIG. 3
FIG. 5
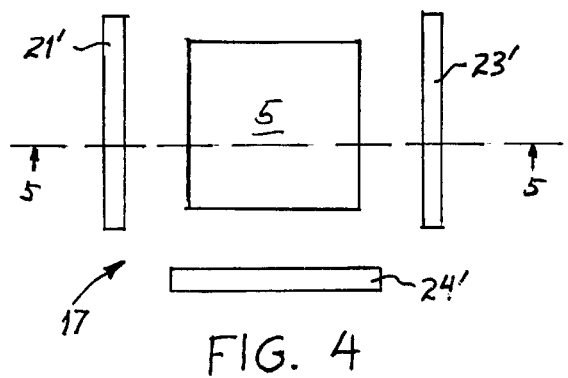
FIG. 4

OVERLAY REGISTRATION ERROR MEASUREMENT MADE SIMULTANEOUSLY FOR MORE THAN TWO SEMICONDUCTOR WAFER LAYERS

RELATED APPLICATIONS

This Application claims priority from U.S. Provisional Patent Application Ser. No. 60/150,759 which was filed on Aug. 26, 1999.

FIELD OF THE INVENTION

This invention is directed toward a measurement technique used in the manufacture of semiconductor wafers and, more particularly, to determine the registration of overlying semiconductor layers with each other.

BACKGROUND OF THE INVENTION

The fabrication of complex semiconductor devices on wafers, typically made of silicon, involves multiple processing steps which produce several overlying layers of different materials. The several layers contain corresponding features designed to cooperate with each other. Displacement between corresponding features on different layers can degrade device performance or can cause the devices to be totally inoperative. Consequently, the wafer layers must be precisely registered, or accurately aligned in stacked position relative to each other, to enable proper operation of each device in accordance with its design. As semiconductor devices have become increasingly complex, the dimensions of the features have been correspondingly reduced. This reduction in feature dimensions has reduced acceptable tolerances on displacement between layers. It is standard practice to set the acceptable tolerance at one-third of the process critical line width. For example, in current 0.18 micron technology, the tolerance is 0.06 micron (60 nanometers).

Since such wafers are expensive to fabricate, it is desirable to measure the overlay registration error (sometimes referred to hereinafter as the "error") after each lithography process, i.e. after the application, or printing, of each layer onto the wafer, in order to verify that the printed layer is in registration with the previous layer within acceptable tolerances. If the error is outside of the acceptable tolerances, the defective layer can, in some cases, be removed and replaced with an accurately registered layer after the fabrication equipment is suitably adjusted based on the measured error. In other cases, the wafer is scrapped, thereby saving the expense of conducting further processing steps on defective wafers. Also, based on such error measurements, it is possible to collect statistical process control ("SPC") data to track the overlay registration errors over time for use in controlling the wafer fabrication process.

A lithography tool is a machine which is essential to wafer fabrication. It places the designed image on the wafer. One such lithography tool is a stepper. For ease of explanation, the word stepper is used herein to represent all types of lithography tools. A stepper places the designed image on the wafer in an array of stepper fields. Each stepper field can include, for example, an array of dies that will be made into electronic components when the wafer is cut along scribe lines. To assist in overlay verification measurements, also known as in-process metrology, it has been common practice to provide each stepper field with a number of registration marks, or targets. For example, a target can be placed in each corner of the stepper field and perhaps another one in its interior area. One version of such a target, known as the "box in box", is shown in FIGS. 1 and 2. Target 1 on wafer 3 includes patterns 5 and 9 formed on layers 7 and 11, respectively. For example, "inner" pattern 5 is usually a solid square of photoresist, and "outer" pattern 9 is usually formed on a substrate layer. Typically, pattern 5 is a 10 micron square and pattern 9 is a 20 micron square.

Other versions of the target are known as "frame in frame" (see 15 in FIG. 3) and "bar in bar" (see 17 in FIG. 4). These are substantially the same in that the corners of target 15 are left out to form target 17. More specifically, outer pattern 19 of target 15 is a set of segments 21–24 joined together to form a continuous wall 15A. Outer pattern 19' of target 17 is a set of segments 21'–24' which are not joined to each other. A cross section of both targets is shown in FIG. 5. Pattern 5 in FIGS. 3 and 4 can be the same solid pattern as shown in FIGS. 1 and 2. Alternatively, it can be a frame or a bar pattern also.

The word "pattern" as used herein broadly refers to any geometric shape that is recognizable by an automated metrology system for the purpose of making overlay registration measurements. The shape can be the external periphery of one body, such as solid square 5, or it can be defined by a plurality of bodies, connected to each other or not, such as the segments 21–24 and 21'–24'.

Automated metrology systems for performing a two-layer overlay registration error measurement are well known. Such a system generates an optical image of the target which is recorded by a CCD camera, and the image is digitized. The digitized image is processed to determine the center position of a pattern. A standard technique for center measurement used in two-layer overlay registration error measurements is to locate the edges of the pattern. There are a number of well known algorithms available to do this, such as pure centroid (center of gravity) and best fit calculations. Once the edges have been located, and since the patterns of the two-layer targets are defined as having a square shape, the center is the direct average of the two horizontal (for y value) and vertical (for x value) edge locations. Such a technique, known as "Smart Plus", is used in the model IVS 120 system available from Schlumberger Verification Systems in Concord, Mass. The portion of the IVS 120 User's Manual relevant to this technique is hereby incorporated by reference.

The overlay registration error between two layers is determined by calculating the difference between the center of the outer pattern and the center of the inner pattern. Once the centers of both patterns are known, the overlay registration error is determined by subtracting the inner pattern center from the outer pattern center. This can be expressed by the following relationship:

$$\text{Overlay Registration Error} = (Or-Ol)-(Ir-Il), (Ob-Ot)-(Ib-It)$$

where
- Or is the x value for the outer pattern right edge;
- Ol is the x value for the outer pattern left edge;
- Ob is the y value for the outer pattern bottom edge;
- Ot is the y value for the outer pattern top edge;
- Ir is the x value for the inner pattern right edge;
- Il is the x value for the inner pattern left edge;
- Ib is the y value for the inner pattern bottom edge;
- It is the y value for the inner pattern top edge.

This derived error is expressed as x,y values that can be mapped onto a statistical plot which displays the limits of the acceptable tolerances. By plotting the x,y values of the derived error, the stepper operator can readily determine whether or not the process is within spec (i.e. the acceptable tolerances have not been exceeded). Moreover, the plotted results may even assist in guiding the operator to make the necessary adjustment in re-applying the defective layer to avoid a repetition of the misregistration. Various types of such plots, as well as diagrams, charts and tables used for process control purposes, are well known and in conventional usage, and selecting a particular one is a matter of design choice.

Automated techniques are also available to provide pass/fail/adjust data based on the two-layer overlay registration measurement error. The error value is used as an input which results in a stepper correction being generated automatically. One such technique is described in a paper by Edward A. Mc Fadden and Christopher P. Ausschnitt titled "A Computer Aided Engineering Workstation for Registration Control", published in SPIE Vol. 1087 of Integrated Circuit Metrology, Inspection, and Process Control III (1989), pages 255–266. This paper is hereby incorporated by reference.

It is not sufficient to measure only the overlay between two layers to insure that they are within the acceptable tolerances because for some layer combinations the overlay is critical among more than just two layers (referred to broadly hereinafter as "multi-layer" overlay). As is well known, one such layer combination includes an active substrate layer (e.g. nitride), a polysilicon layer and a first contact (i.e. metalization) layer. This is probably the most critical tolerance in a wafer fabrication process. The first contact layer must be precisely aligned to both the polysilicon and nitride layers within tight tolerances. Even if the permissible 60 nanometer error (for 0.18 micron technology) occurs between each of the polysilicon/nitride two-layer overlay and the first contact/polysilicon two-layer overlay, the possible maximum resulting total overlay registration error of 120 nanometers for the first contact/nitride overlay would be well beyond its acceptable tolerances which is also 60 nanometers.

Tri-layer measurements have been made for years by the semiconductor wafer manufacturers (wafer fabs). However, none has put these measurements together in a single process that will save time, increase throughput, and automate the stepper adjustment process. The method that wafer fabs most commonly use currently is to do two separate two-layer overlay measurements (e.g. nitride/first contact and polysilicon/first contact) to provide a pass-fail criterion for the wafer. However, this has several disadvantages. Firstly, it takes twice as long to do two separate two-layer measurements as it does to do one two-layer measurement. Consequently, this approach reduces throughput. Secondly, stepper adjustments cannot simply be made for one layer to correct a multi-layer overlay registration error because the adjustment for one two-layer overlay is not independent of adverse effects on the other two-layer overlay. Consequently, a multi-layer overlay registration error derived this way often requires the intervention of a process engineer to determine the needed adjustment to the stepper. The engineer must then guess as to the correct adjustment since the data for one of the two-layer overlays is presented separately from the other. This reliance on skilled labor is costly, and the entire operation further adds to the time required to adjust the stepper, with attendant adverse consequences on throughput.

SUMMARY OF THE INVENTION

One object of the present invention is to provide an improved technique for measuring registration of overlying semiconductor layers with each other.

Another object of the present invention is to enable simultaneously measuring registration of more than two overlying semiconductor layers with each other.

Yet another object of the present invention is to provide a target for multi-layer overlay registration verification which requires no more wafer surface space then a two-layer overlay target.

A further object of the present invention is to develop a target that will allow measuring registration among more than two overlying semiconductor layers at once.

One other object of the present invention is to develop a methodology that will allow measuring registration among more than two overlying semiconductor layers at once and obtain a useful overlay registration error measurement.

Yet another object of the present invention is to facilitate wafer processing in case of an overlay registration error among more than two overlying semiconductor layers without the intervention of a process engineer.

Another object of the present invention is to provide improved throughput when conducting and analyzing a multi-layer overlay registration error measurement.

These and other objects are attained in accordance with one aspect of the present invention directed to a method for forming a target used to measure registration relative to each other of more than two layers of a semiconductor wafer. At least first, second and third layers are formed to overlay each other. A first pattern is provided in a designated location of the first layer. A second pattern is provided in a designated location of the second layer, such second pattern having a given shape and a given size, and having at least one discontinuity formed therein at a predetermined location. A third pattern is provided in a designated location of the third layer, such third pattern having the given shape and the given size of the second pattern, and having at least one discontinuity formed therein at a predetermined location, wherein a portion of each one of the second and third patterns fits within the at least one discontinuity in the other when the second and third layers are in registration with each other.

Another aspect of the present invention is directed to a method for measuring registration relative to each other of more than two layers of a semiconductor wafer. At least first, second and third layers are formed to overlay each other. A first pattern is provided in a designated location of the first layer. A second pattern is provided in a designated location of the second layer, such second pattern having a given shape and a given size, and having at least one discontinuity formed therein at a predetermined location. A third pattern is provided in a designated location of the third layer, such third pattern having the given shape and the given size of the second pattern, and having at least one discontinuity formed therein at a predetermined location, wherein a portion of each one of the second and third patterns fits within the at least one discontinuity in the other when the second and third layers are in registration with each other. The method further includes measuring an overlay registration error between the first pattern and each of the second and third patterns.

Another aspect of the present invention is directed to a method for measuring registration relative to each other of more than two layers of a semiconductor wafer being fabricated with a stepper controlled to position a plurality of stepper fields to apply each layer of the wafer. A first pattern is provided in a designated location of a stepper field forming a first layer. A second pattern is provided in a designated location of a stepper field forming a second layer, such second pattern having a given shape and a given size, and having at least one discontinuity formed therein at a predetermined location. A third pattern is provided in a designated location of a stepper field forming a third layer, such third pattern having the given shape and the given size of the second pattern, and having at least one discontinuity formed therein at a predetermined location, wherein a portion of each one of the second and third patterns fits within at least one discontinuity in the other when the second and third layers are in registration with each other. The method further includes measuring an overlay registration error between the first pattern and each of the second and third patterns.

Another aspect of the present invention is directed to a method for fabricating a semiconductor wafer. At least first, second and third layers are formed to overlay each other. A first pattern is provided in a designated location of the first layer. A second pattern is provided in a designated location of the second layer, such second pattern having a given shape and a given size, and having at least one discontinuity formed therein at a predetermined location. A third pattern is provided in a designated location of the third layer, such third pattern having the given shape and the given size of the second pattern, and having at least one discontinuity formed therein at a predetermined location, wherein a portion of each one of the second and third patterns fits within the at least one discontinuity in the other when the second and third layers are in registration with each other. A first overlay registration error is measured between the first pattern and the second pattern. A second overlay registration error is measured between the first pattern and the third pattern. An average error of said first and second overlay registration measurement errors is obtained, and further processing of the wafer is automatically determined based on the average error.

Another aspect of the present invention is directed to an apparatus to automatically control a process for fabricating a semiconductor wafer. The apparatus includes means for forming at least first, second and third layers which overlay each other, and means for providing a first pattern in a designated location of the first layer. The apparatus also includes means for providing a second pattern in a designated location of the second layer, such second pattern having a given shape and a given size, and having at least one discontinuity formed therein at a predetermined location. Another means is included for providing a third pattern in a designated location of the third layer, such third pattern having the given shape and the given size of the second pattern, and having at least one discontinuity formed therein at a predetermined location, wherein a portion of each one of the second and third patterns fits within the at least one discontinuity in the other when the second and third layers are in registration with each other. A measuring means measures a first overlay registration error between the first pattern and the second pattern, and another measuring means measures a second overlay registration error between the first pattern and the third pattern. The apparatus also includes means for obtaining an average error of the first and second overlay registration measurement errors, and control means for automatically determining further processing of the wafer based on the average error.

BRIEF DESCRIPTION OF THE DRAWINGS

FIG. 1 shows a top view of a conventional "box in box" target for verifying overlay registration between two semiconductor layers FIG. 2 shows a cross section taken along line 2—2 in FIG. 1.

FIG. 3 shows a top view of a conventional "frame in frame" target.

FIG. 4 shows a top view of a conventional "bar in bar" target.

FIG. 5 shows a cross section taken along line 5—5 in FIGS. 3 and 4.

DETAILED DESCRIPTION OF THE DRAWINGS

The invention provides an improved multi-layer overlay verification target. For the specific situation of a tri-layer overlay, the new target incorporates three process layers, such as two substrates and one photoresist, which allows for the simultaneous measurement of the displacement for three layers in one image made by the overlay metrology system. The target is imaged and measurements are made to provide the displacement of all three layers at once in accordance with the invention. The invention also enables use of the measurement results to automatically provide the correction data needed for the stepper operator, without the intervention of a process engineer, to make a determination on pass, fail, and/or stepper adjustments. This invention also enables use of the measurement results to track the information for SPC purposes.

The target can be designed in a number of ways to achieve the same results, as disclosed below. The process of imaging the pattern and digitizing that image is conventional, as described above, and will not vary from one target design to another. However, the processing of that digitized image will vary depending on the target, as explained below.

Figure 7:
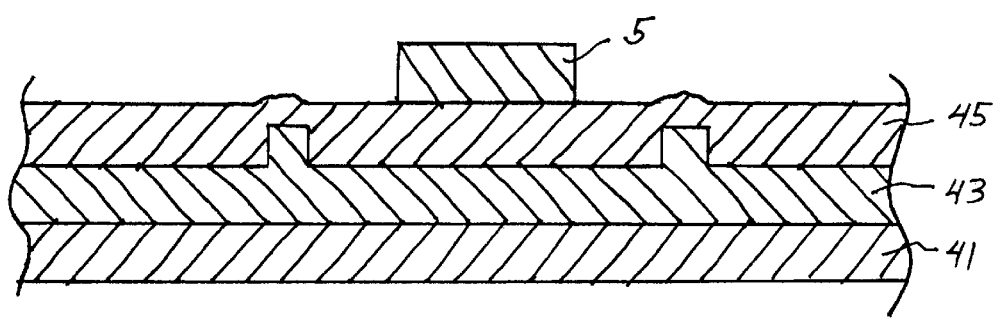
FIG. 7 shows a cross section taken along line 7—7 in FIG. 6.
Figure 8:
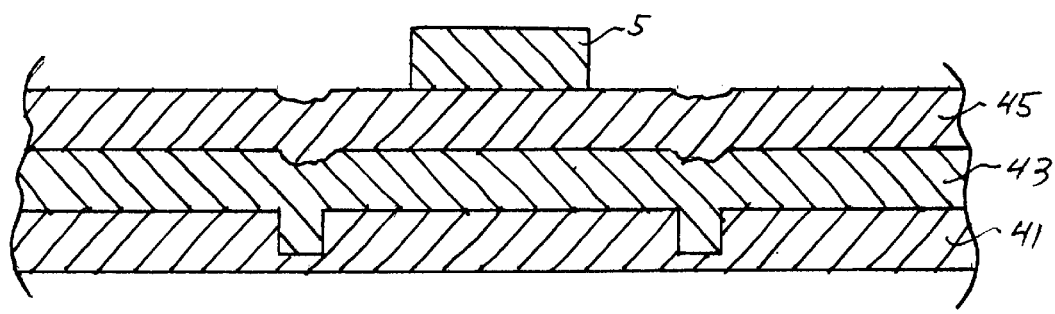
FIG. 8 shows a cross section taken along line 8—8 in FIG. 6.

One example of three layers that can be used to illustrate the invention is shown in FIGS. 7 and 8. Nitride layer 41 is overlaid by polysilicon layer 43, and first contact layer 45 is applied onto that. As is well known, the photoresist layer 5 on first contact layer 45 is used as part of a process to etch away all of layer 45 but for what is covered by the photoresist. Consequently, when the wafer process is at the stage depicted in FIGS. 7 and 8, use of the photoresist position to determine its registration relative to layers 41 and 43 is the same as determining the registration of the layer 45, after etching, to the other layers.

Keeping the above in mind, the tri-layer target design of the invention enables measuring the overlay of, for example, photoresist to two substrates at once. This tri-layer target uses the two layer overlay verification target as a basis for its design. Key changes to the two layer target are required, as explained below, to accommodate this enhanced measurement.

Figure 6:
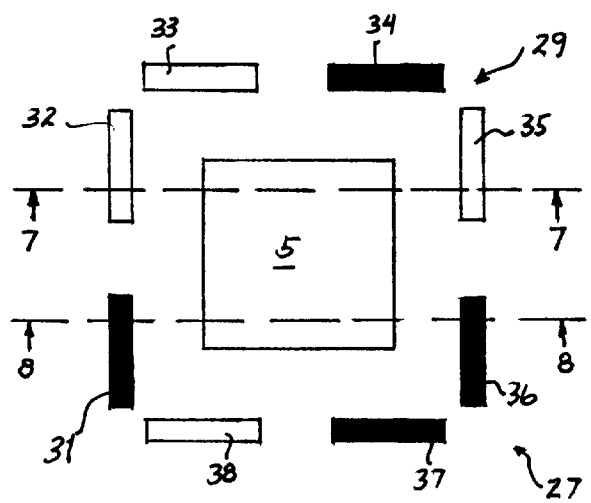
FIG. 6 shows a top view of a target arranged in accordance with the invention.

FIG. 6 depicts a target 27 arranged in accordance with the invention. This target allows for the error measurement to be made using the same general layout and wafer surface space as a two-layer target, such as shown in FIGS. 3 and 4, but adding a second substrate layer to the outer pattern.

More specifically, target 27 includes inner pattern 5 which is a solid, square pattern of photoresist as in the other targets, and an outer pattern 29 made up of eight segments 31–38.

Pattern 29 is actually an interleaved combination of two patterns on the two respective substrate layers. Referring to the composition of the tri-layer combination with a particularly critical tolerance discussed above (i.e. nitride, polysilicon and first contact), FIGS. 6, 7 and 8 clearly depict this arrangement. The black segments 31, 34, 36 and 37 compose a pattern formed in nitride layer 41 (see FIG. 8), whereas blank segments 32, 33, 35 and 38 compose a pattern formed in polysilicon layer 43 (see FIG. 7). These patterns are created in a well known manner and, thus, details thereof are not deemed necessary.

As can readily be seen from a comparison of FIG. 6 with the targets in FIGS. 1, 3 and 4, the tri-layer target 27 requires no more wafer surface space than the conventional two-layer targets. This highly advantageous characteristic is achieved by creating a discontinuity(as seen in a top view) in the pattern for one substrate layer which leaves enough space to accommodate therein at least a portion of the pattern for the other substrate layer when the two substrate layers are in registration with each other. More specifically, a discontinuity is provided in the pattern for the nitride layer, such as between segments 31 and 37. A correspondingly offset discontinuity is set in the polysilicon layer, such as between segments 32 and 38. When these two layers are overlayed in registration with each other, the segments of one fit into the discontinuity formed in the other. Consequently, it will be readily understood that the invention can be used with bar in bar targets, for example.

As explained above, the automated metrology system obtains one image for a two-layer overlay, but the prior art requires two separate two-layer overlay images for a tri-layer overlay registration error measurement. However, in accordance with an advantageous aspect of the present invention, only one image is required even for a multi-layer overlay registration error measurement.

More specifically, the same well known edge-location processing technique can be utilized to locate the pattern edges. However, whereas the processing is arranged to find edges for only four segments of the outer pattern with the targets of FIGS. 1, 3 and 4, the processing must locate edges for eight segments in the outer pattern with the target of FIG. 6. Modifying the well known processing to locate the additional segments and their edges is a straightforward task readily apparent to anyone with ordinary skill in the art, so details thereof are not needed.

Once the edges for segments 31–38 and photoresist 5 have been located, the system can perform a two-layer overlay registration error measurement between photoresist 5 and, say, the nitride layer 41 by using the above-described prior art "Smart Plus" two-layer technique. The same approach is then used to perform a two-layer overlay registration error measurement between photoresist 5 and the polysilicon layer 43.

The additional processing required to find four extra segments does, of course, require more processing time. However, this additional time is negligible in comparison with the time required to image and process a separate two-layer overlay. Consequently, the invention produces a considerable time savings, and a consequently improved throughput for the wafer fab.

Figure 9:
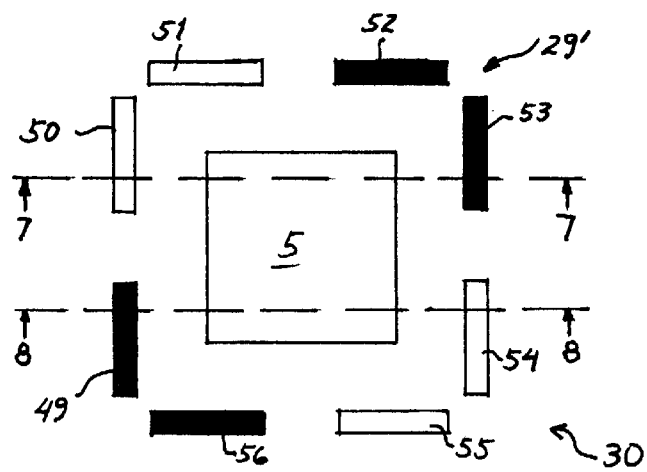
FIG. 9 shows a top view of another embodiment of a target arranged in accordance with the invention.

FIG. 9 shows another tri-layer target 30 that is a variation of the first and should also work well. The main difference between the two is that in FIG. 6 the segments of the pattern 29 for the same layer on opposite edges face each other. Thus, segment 32 faces segment 35 on the polysilicon layer, and segments 34 and 37 face each other on the nitride layer. This is not so for the target 30 of FIG. 9 which depicts pattern 29' made up of eight segments 49–56. Facing segments 49 and 54, for example, are on different layers. However, it is essential of course to have at least one segment for the pattern of a layer on each edge of the target. This type of pattern presents no measurement or processing difficulties when it is recognized that the system merely has to be programmed to associate segments 50 and 54 with the polysilicon layer, and so on, which is a straight-forward task.

Up to this point, the description of the invention has focused on a tri-layer target. However, the invention is readily applicable to simultaneous measurement of the overlay registration error for more than just three layers. In FIGS. 6 and 9, each of the four edges of the outer pattern is shown as having only two segments, one from each of the layers. Conceptually, more than two segments could be used. Thus, for a four-layer target, each edge could have three segments, one from each of three substrate layers. The only constraint imposed on how many layers can be measured in accordance with the invention is one of size. Thus, if more wafer surface space were made available, more than two segments could fit along one edge. Similarly, if the size of the segments could be reduced without compromising the accuracy and reliability of the measurement, more segments could fit along each edge. Of course, a combination of these two possibilities could also be used toward this end if a slight increase in wafer surface space were combined with a slight decrease in segment dimensions.

Figure 10:
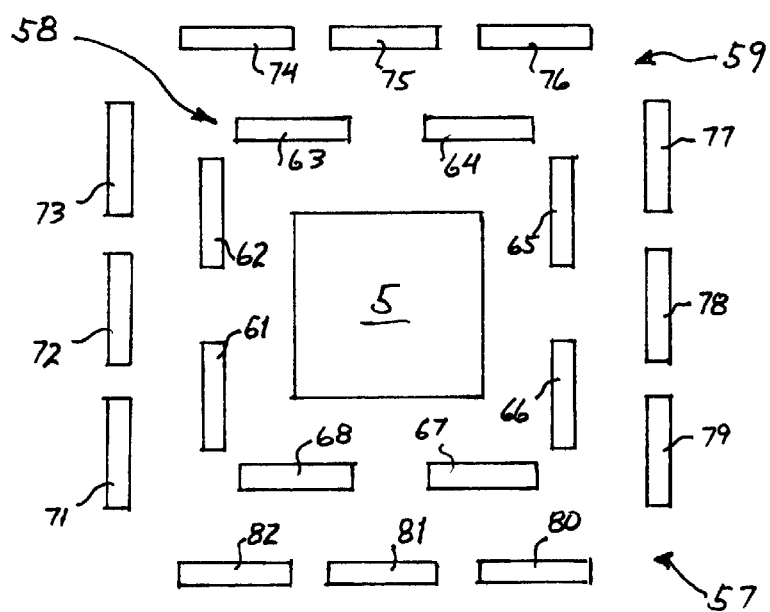
FIG. 10 shows a top view of yet another embodiment of a target arranged in accordance with the invention.

FIG. 10 discloses another approach for arranging a multi-layer target to implement the present invention. However, it adds to the inner and outer patterns of the above-disclosed tri-layer patterns yet another pattern which is beyond the outer pattern. Therefore, this embodiment of the multi-layer target inherently requires more wafer surface space than the conventional two-layer targets and the above-disclosed tri-layer targets. More specifically, target 57 includes inner pattern 5, intermediate pattern 58, and outer pattern 59. Pattern 5 can be the same photoresist as shown in the targets discussed above. Pattern 58 is made up of eight segments 61–68. Segments 61–68 are shown in blank for the sake of convenience. However, it should be understood that these segments can be the same as those disclosed in FIGS. 6 and 9 (i.e. 31–38, 49–56) in connection with the trilayer targets.

Pattern 59 of target 57 is made up of 12 segments 71–82. For the sake of convenience, these are all shown as blank. However, it can readily be understood that the addition of pattern 59 enables conducting a simultaneous overlay registration error measurement for an additional three layers, making a total of six layers. Thus, for example, segments 71, 74, 79 and 82 would compose a pattern on one layer, segments 72, 75, 78 and 81 would compose a pattern on another layer, and segments 73, 76, 77 and 80 would compose a pattern on the remaining layer. Of course, other segment assignments to the different layers could also be readily made.

Processing of the digitized image data obtained from the target of FIG. 10 would, of course, require more time than for FIGS. 6 and 9. However, with the ever-increasing processing speeds of microprocessor chips, this additional time is a minor factor, particularly when compared with the substantial time saved in performing the multi-layer registration verification at once, with one image.

The tri-layer measurement can be applied in accordance with the invention, in the above-used example, to determine the registration of the photoresist layer (and consequently the first contact layer) to the nitride layer. This is accomplished by applying the conventional two-layer calculation described in detail above, or another of the well known techniques that can locate the centers of the patterns. Likewise, the registration of the photoresist layer to the polysilicon layer can be determined in the same way.

From these tri-layer measurements, the invention can also calculate the overlay registration error between the nitride layer and the polysilicon layer. This is a straightforward mathematical calculation which is readily apparent and, thus, no details are deemed necessary.

In accordance with another advantageous aspect of the invention, it determines the average error of (1) the nitride/photoresist overlay registration error, and (2) the polysilicon/photoresist overlay registration error. This number is indicative of the displacement between the first contact layer and the two other layers, and it is particularly valuable for automating the pass/fail/adjust decision-making process. As explained above, the conventional automated metrology system utilizes an algorithm for adjusting the stepper based on a two-layer overlay registration error. However, the prior art tri-layer overlays could not perform an automated decision-making procedure because they were dependent on two separate two-layer overlay images. Now, with the single-image, multi-layer overlay approach of the present invention, it is possible to use the average of the two above-mentioned errors as a highly effective input into the conventional automated system to reach a pass/fail decision. Moreover, this approach can rely on the calculated average to determine a stepper adjustment with the conventional automated system. Thus, the intervention of a process engineer is not required, and an improved throughput can be achieved.

The invention can also be used to calculate a weighted average of the two above-mentioned measurement errors. This could advantageous in a number of situations. For example, the acceptable tolerance for the first contact/nitride layer might be different from the acceptable tolerance for the first contact/polysilicon layer. In such case, the average would be weighted accordingly.

It is contemplated that the output produced in accordance with the invention will be the following measurements of overlay registration error:

1. Photoresist to first substrate
2. Photoresist to second substrate
3. First substrate to second substrate
4. Photoresist to average of 1 and 2
5. Photoresist to weighted average of 1 and 2

Although several embodiments of the present invention have been described in detail above, various modifications thereto will be readily apparent to anyone with ordinary skill in the art. For example, the invention includes the disclosed targets and any subsets and combinations of such targets. These and other such modifications are intended to fall within the scope of the present invention as defined by the following claims.

I claim:

1. A method for forming a target used to simultaneously measure registration relative to each other of more than two layers of a semiconductor wafer, comprising:

forming at least first, second and third layers which overlay each other;

providing a first pattern in a designated location of said first layer;

providing a second pattern in a designated location of said second layer, said second pattern having a given shape and a given size, and having at least one discontinuity formed therein at a predetermined location; and providing a third pattern in a designated location of said third layer, said third pattern having said given shape and said given size of said second pattern, and having at least one discontinuity formed therein at a predetermined location, wherein a portion of each one of said second and third patterns fits within the at least one discontinuity in the other when the second and third layers are in registration with each other.

2. The method of claim 1, wherein the second and third patterns form a combined pattern having said given shape and said given size when the second and third layers are in registration.

3. The method of claim 2, wherein said combined pattern is in the form of an outer periphery with the first pattern accommodated therein when the first, second and third layers are in registration.

4. The method of claim 3, wherein said combined pattern is a multi-sided, straight-sided geometric shape.

5. The method of claim 4, wherein said given shape of said combined pattern is a square.

6. The method of claim 4, wherein said second and third patterns are comprised of multiple, separated segments.

7. The method of claim 6, wherein segments belonging to said respective second and third patterns are on opposite sides of the target.

8. The method of claim 7, wherein said segments belonging to said respective second and third patterns which are on opposite sides of the target face each other.

9. The method of claim 2, wherein said second and third patterns are comprised of multiple, separated segments, each side of the combined pattern having at least one segment and one discontinuity associated respectively with said second and third patterns.

10. The method of claim 1, further comprising:

forming a fourth layer and a fifth layer;

providing a fourth pattern in a designated location of said fourth layer, said fourth pattern having said given shape and a size different from said given size, and having at least one discontinuity formed therein at a predetermined location; and;

providing a fifth pattern in a designated location of said fifth layer, said fifth pattern having said given shape and said size of said fourth pattern, and having at least one discontinuity formed therein at a predetermined location, wherein a portions of each one of said fourth and fifth patterns fits within the at least one discontinuity in the other when the fourth and fifth layers are in registration with each other.

11. The method of claim 10, wherein the fourth and fifth patterns form another combined pattern having said given shape and said given size of said fourth pattern when the fourth and fifth layers are in registration.

12. The method of claim 11, wherein said fourth and fifth patterns are comprised of multiple, separated segments, each side of the other combined pattern having at least one segment and one discontinuity associated respectively with said fourth and fifth patterns.

13. A method for simultaneously measuring registration relative to each other of more than two layers of a semiconductor wafer, comprising:

forming at least first, second and third layers which overlay each other;

providing a first pattern in a designated location of said first layer;

providing a second pattern in a designated location of said second layer, said second pattern having a given shape and a given size, and having at least one discontinuity formed therein at a predetermined location;

providing a third pattern in a designated location of said third layer, said third pattern having said given shape and said given size of said second pattern, and having at least one discontinuity formed therein at a predetermined location, wherein a portion of each one of said second and third patterns fits within the at least one discontinuity in the other when the second and third layers are in registration with each other; and simultaneously measuring an overlay registration error between said first pattern and each of said second and third patterns.

14. A method for simultaneously measuring registration relative to each other of more than two layers of a semiconductor wafer being fabricated with a stepper controlled to position a plurality of stepper fields to apply each layer of the wafer, comprising:

providing a first pattern in a designated location of a stepper field forming a first layer;

providing a second pattern in a designated location of a stepper field forming a second layer, said second pattern having a given shape and a given size, and having at least one discontinuity formed therein at a predetermined location;

providing a third pattern in a designated location of a stepper field forming a third layer, said third pattern having said given shape and said given size of said second pattern, and having at least one discontinuity formed therein at a predetermined location, wherein a portion of each one of said second and third patterns fits within at least one discontinuity in the other when the second and third layers are in registration with each other; and simultaneously measuring an overlay registration error between said first pattern and each of said second and third patterns.

15. A method for fabricating a semiconductor wafer, comprising:

forming at least first, second and third layers which overlay each other;

providing a first pattern in a designated location of said first layer;

providing a second pattern in a designated location of said second layer, said second pattern having a given shape and a given size, and having at least one discontinuity formed therein at a predetermined location;

providing a third pattern in a designated location of said third layer, said third pattern having said given shape and said given size of said second pattern, and having at least one discontinuity formed therein at a predetermined location, wherein a portion of each one of said second and third patterns fits within the at least one discontinuity in the other when the second and third layers are in registration with each other;

measuring a first overlay registration error between said first pattern and said second pattern, and simultaneously measuring a second overlay registration error between said first pattern and said third pattern;

obtaining an average error of said first and second overlay registration measurement errors; and automatically determining further processing of said wafer based on said average error.

16. The method of claim 15, wherein said average error is a weighted average.

17. The method of claim 16, wherein weighting for said weighted average is based on acceptable tolerances for the first and second overlay registration errors.

18. The method of claim 15, wherein said automatic determination of further processing includes a pass/fail for said wafer.

19. The method of claim 15, wherein said automatic determination of further processing includes adjusting the stepper to correct for first and second overlay registration measurement errors.

20. A method for fabricating a semiconductor wafer, comprising:

forming at least first, second and third layers which overlay each other;

providing a first pattern in a designated location of said first layer;

providing a second pattern in a designated location of said second layer, said second pattern having a given shape and a given size, and having at least one discontinuity formed therein at a predetermined location;

providing a third pattern in a designated location of said third layer, said third pattern having said given shape and said given size of said second pattern, and having at least one discontinuity formed therein at a predetermined location, wherein a portion of each one of said second and third patterns fits within the at least one discontinuity in the other when the second and third layers are in registration with each other;

measuring a first overlay registration error between said first pattern and said second pattern;

measuring a second overlay registration error between said first pattern and said third pattern;

obtaining an average error of said first and second overlay registration measurement errors; and automatically determining further processing of said wafer based on said average error, wherein said automatic determination of further processing includes a pass/fail for said wafer.

* * * * *